United States Patent

Chew et al.

(10) Patent No.: US 8,846,519 B2
(45) Date of Patent: Sep. 30, 2014

(54) INTERCONNECTIONS FOR FINE PITCH SEMICONDUCTOR DEVICES AND MANUFACTURING METHOD THEREOF

(75) Inventors: Hwee-Seng Jimmy Chew, Singapore (SG); Chee Kian Ong, Singapore (SG)

(73) Assignee: Advanpack Solutions Pte Ltd., Singapore (SG)

(*) Notice: Subject to any disclaimer, the term of this patent is extended or adjusted under 35 U.S.C. 154(b) by 0 days.

(21) Appl. No.: 13/467,635

(22) Filed: May 9, 2012

(65) Prior Publication Data

US 2012/0220118 A1 Aug. 30, 2012

Related U.S. Application Data

(60) Division of application No. 11/905,482, filed on Oct. 1, 2007, now Pat. No. 8,207,608, which is a continuation-in-part of application No. 11/889,879, filed on Aug. 17, 2007, now abandoned.

(30) Foreign Application Priority Data

Oct. 14, 2006 (TW) ................................ 95137971 A

(51) Int. Cl.
*H01L 21/44* (2006.01)

(52) U.S. Cl.
USPC .......... 438/613; 438/612; 438/614; 438/615; 257/E21.508; 257/E21.509

(58) Field of Classification Search
CPC ......... H01L 24/03; H01L 24/05; H01L 24/11; H01L 24/13
USPC .................. 438/612–617, 678, 687
See application file for complete search history.

(56) References Cited

U.S. PATENT DOCUMENTS

| | | | |
|---|---|---|---|
| 5,431,803 A | 7/1995 | DiFranco et al. | |
| 5,877,556 A | 3/1999 | Jeng et al. | |
| 6,093,964 A | 7/2000 | Saitoh et al. | |
| 6,229,220 B1 | 5/2001 | Saitoh et al. | |
| 6,565,729 B2 * | 5/2003 | Chen et al. | 205/82 |
| 6,578,754 B1 | 6/2003 | Tung | |
| 6,592,019 B2 | 7/2003 | Tung | |
| 6,681,982 B2 | 1/2004 | Tung | |

(Continued)

FOREIGN PATENT DOCUMENTS

| | | |
|---|---|---|
| CN | 200965875 Y | 10/2007 |
| TW | 373037 | 11/1999 |
| TW | I248221 B | 1/2006 |
| TW | I255514 B | 5/2006 |

*Primary Examiner* — Jose R Diaz
(74) *Attorney, Agent, or Firm* — Rabin & Berdo, P.C.

(57) ABSTRACT

A semiconductor device and a manufacturing method thereof are provided. The semiconductor device has an active surface. The semiconductor device includes at least a connecting element and at least a bump. The connecting element is disposed on the activate surface and has a minimum dimension smaller than 100 microns. The bump is disposed on the connecting element and is electrically connected to the active surface by the connecting element. The bump includes a pillar part disposed on the connecting element and a top part disposed on the top of the pillar part. The pillar part has a first dimension and a second dimension both parallel to the active surface. The first dimension is more than 1.2 times the second dimension. The top part is composed of solder and will melt under a pre-determined temperature. The pillar part will not melt under the pre-determined temperature.

17 Claims, 8 Drawing Sheets

(56) References Cited

U.S. PATENT DOCUMENTS

| | | |
|---|---|---|
| 6,740,985 B1 | 5/2004 | Zhao |
| 6,911,722 B2 | 6/2005 | Ohuchi et al. |
| 7,271,483 B2 | 9/2007 | Lin et al. |
| 2001/0040290 A1 | 11/2001 | Sakurai et al. |
| 2003/0102551 A1 | 6/2003 | Kikuchi |
| 2005/0017372 A1 | 1/2005 | Lua et al. |
| 2005/0077624 A1* | 4/2005 | Tan et al. ............ 257/737 |
| 2005/0263883 A1 | 12/2005 | Wang et al. |
| 2006/0087034 A1 | 4/2006 | Huang et al. |
| 2007/0152328 A1 | 7/2007 | Jadhav et al. |

* cited by examiner

INTERCONNECTIONS FOR FINE PITCH SEMICONDUCTOR DEVICES AND MANUFACTURING METHOD THEREOF

This application is a divisional application of U.S. application Ser. No. 11/905,482, filed Oct. 1, 2007, which is a continuation-in-part application of U.S. application Ser. No. 11/889,879, filed Aug. 17, 2007 (now abandoned), which claims the benefit of Taiwan application Serial No. 95137971, filed Oct. 14, 2006. These related applications are incorporated herein by reference.

BACKGROUND OF THE INVENTION

1. Field of the Invention

The invention relates in general to a semiconductor device and a manufacturing method thereof, and more particularly to a semiconductor device with fine pitch and a manufacturing method thereof.

2. Description of the Related Art

With the advance in science and technology, various electronic products are invented and marketed. As the electronic products are widely applied in everyday life, the demand for semiconductor devices is increasing. Due to the trend toward slimness and lightness of weight in the design of semiconductor device, despite the size reduction of a semiconductor device, the number of I/Os actually increases as the pitch and the width are both miniaturized. Fine pitch technology is thus developed to resolve the above problem.

Referring to FIG. 1~3. FIGS. 1~2 are side views of a conventional semiconductor device 900. FIG. 3 is a top view of a semiconductor device 900 of FIGS. 1~2. The semiconductor device 900 is a semiconductor device with fine pitch. The semiconductor device 900 includes a plurality of bonding pads 910 and a plurality of bumps 920. As indicated in FIG. 1, the bonding pad 910 is disposed on an active surface 900a of the semiconductor device 900 and arranged along the direction of X-axis, wherein the bump 920 has a column structure. In the fine pitch technology, the pitch G910 of the bonding pad 910 is as small as 50 um or even under 35 um. As viewed from the view-angle of FIG. 3, the bump 920 has a circular cross-sectional area parallel to the active surface 900a.

The column bump 920 is vertically disposed on the bonding pad 910. The semiconductor device 900 is electrically connected to the contact points (not illustrated in the diagram) disposed on a flip-chip carrier (normally, the flip-chip carrier is a PCB) via the column bump 920 to form a package structure by a package assembly process for example. Thus, electrical signals are transmitted between the flip-chip carrier and the semiconductor device 900 via the bump 920.

However, during the process of assembling the semiconductor device 900 to the flip-chip carrier, the column bump 920 will bend easily during the process of moving or aligning as indicated in the rightmost bump of FIG. 1 and the bump of FIG. 2. Consequently, the semiconductor device cannot be firmly assembled on the flip-chip carrier. In the worst [worse] case, a short-circuit may occur, severely affecting the electrical functions of the package structure so that assembled device is defective.

The above defective semiconductor device 900 is hard to be re-worked, and is thus wasted. In the case where the defective semiconductor device 900 can be re-worked, the cost involved is expensive. Furthermore, several monitoring and inspection systems need to be employed in the manufacturing process to prevent the defective product from going to the next manufacturing process, which may in turn cause an even larger loss. Thus the manufacturing process will incur more costs.

Thus, how to resolve the above problem has become an important issue in the research and development of semiconductor device.

SUMMARY OF THE INVENTION

According to an aspect of an embodiment of the invention, a semiconductor device and a manufacturing method thereof are provided. The first dimension of the bump is more than 1.2 times the second dimension, or the length of the bump is greater than 1.2 times the width of the bump, such that the semiconductor device and manufacturing method thereof still possess excellent structural strength under the restriction of fine pitch. Thus, the semiconductor device and manufacturing method thereof disclosed in the above embodiments of the invention at least have the advantages of having enhanced structural strength, improved yield rate and reduced manufacturing cost.

According to another aspect of an embodiment of the present invention, a semiconductor device is provided. The semiconductor device has an active surface. The semiconductor device includes at least a connecting element and at least a bump. The connecting element is disposed on the active surface and has a minimum dimension smaller than 100 microns. The bump is disposed on the connecting element and is electrically connected to the active surface by the connecting element. The bump includes a pillar part disposed on the connecting element and a top part disposed on the top of the pillar part. The pillar part has a first dimension and a second dimension both parallel to the active surface. The first dimension is more than 1.2 times the second dimension. The top part is composed of solder and will melt at a pre-determined temperature. The pillar part will not melt at the pre-determined temperature.

According to another aspect of an embodiment of the present invention, a semiconductor device is provided. The semiconductor device has an active surface. The semiconductor device includes a plurality of bonding pads and a plurality of bumps. The bonding pads are disposed on the active surface. Each of the bumps is disposed on the corresponding bonding pad. Each of the bumps includes a top part. Wherein there is a plurality of contact points disposed on a package substrate corresponding to the bumps, the contact points directly contact the top part; the pitch between the adjacent contact points is larger than the pitch between the adjacent bonding pads of the active surface.

According to another aspect of an embodiment of the present invention, a semiconductor device is provided. The semiconductor device has an active surface. The semiconductor device includes a plurality of bonding pads and a plurality of bumps. The bonding pads are disposed on the active surface. Each of the bumps is disposed on the corresponding bonding pad. Each of the bumps includes a top part. Wherein a plurality of contact points disposed on a package substrate corresponding to the bumps, the contact points directly contact the solder part; the center of each of the bumps is not directly above the corresponding contact point.

According to another aspect of an embodiment of the present invention, a manufacturing method of semiconductor device is provided. The semiconductor device includes a bonding pad disposed on an active surface of the semiconductor device. The manufacturing method of semiconductor device at least includes the following steps. Firstly, a first metal layer is deposited above the bonding pad and part of the active surface, wherein the first metal layer has a first dimension and a second dimension both parallel to the active surface, the first dimension is longer than 1.2 times the second dimension, and the first metal layer will not melt under a pre-determined temperature. Secondly, a second metal layer is formed above the first metal layer, wherein the second metal layer will melt under the pre-determined temperature, and the first metal layer and the second metal layer form a bump.

According to another aspect of an embodiment of the present invention, a manufacturing method of semiconductor device is provided. The manufacturing method of semiconductor device at least includes the following steps. Firstly, a die is provided, wherein the die includes a bonding pad disposed on an active surface of the die. Secondly, a UBM layer is formed on the bonding pad under an inert gas environment. Thirdly, a photosensitive material is formed on the UBM layer and the active surface and the photosensitive material is patterned to form at least an opening for exposing the UBM layer and part of the active surface. Fourthly, the die is placed in a solution including the first metal ions, wherein the solution includes copper ions ($Cu^{++}$), sulfuric acid ($H_2SO_4$) and chloride ions, the copper ions have a concentration between 10~40 gram/liter, the sulfuric acid has a concentration between 120~300 gram/liter, the chloride ions have a concentration between 30~70 ppm such that a first metal layer is electroplated in the opening, wherein the first metal layer contacts the UBM layer. Fifthly, a second metal layer is formed in part of the opening, wherein the second metal layer contacts the first metal layer, such that the first metal layer and the second metal layer form a bump. Lastly, the photosensitive material is removed.

According to another aspect of an embodiment of the present invention, a semiconductor device is provided. The semiconductor device comprises at least a connecting element and at least a bump. The connecting element has a minimum dimension smaller than 100 microns, wherein the connecting element is disposed on the active surface. The bump is disposed on the connecting element and electrically connected to the active surface by the connecting element, wherein the bump comprises a pillar part disposed on the connecting element and a top part disposed on the top of the pillar part, the pillar part has a first dimension and a second dimension both parallel to the active surface, the first dimension is more than 1.2 times the second dimension, the top part is composed of solder and will melt at a pre-determined temperature, and the pillar part will not melt at the the pre-determined temperature. Wherein the material of the pillar part is selected from a group consisting of copper (Cu), gold (Au), nickel (Ni) or a combination thereof, and the top part extending from the top of the pillar part and disposed thereon is made from tin (Sn)-lead (Pb) or any lead free solders.

According to another aspect of an embodiment of the present invention, a semiconductor device with an active surface is provided. The semiconductor device comprises a plurality of bonding pads and a plurality of bumps. The bonding pads are disposed on the active surface. The bumps are disposed on the bonding pads respectively, wherein each bump comprises a pillar part disposed on the bonding pad and a top part composed of solder, the top part is disposed on the top of the pillar part, and the connecting lines of the bonding pads and the bumps are arranged in off-centered arrangement.

The invention with the above advantages and other advantages will become apparent from the following detailed description of the preferred embodiment. The following description is made with reference to the accompanying drawings.

BRIEF DESCRIPTION OF THE DRAWINGS (Prior Art) FIGS. 1~2 are side views of a conventional semiconductor device;

(Prior Art) FIG. 3 is a top view of a semiconductor device of FIGS. 1~2;

FIGS. 4~5 are side views of a semiconductor device according to a first embodiment of the invention;

Figure 9A:
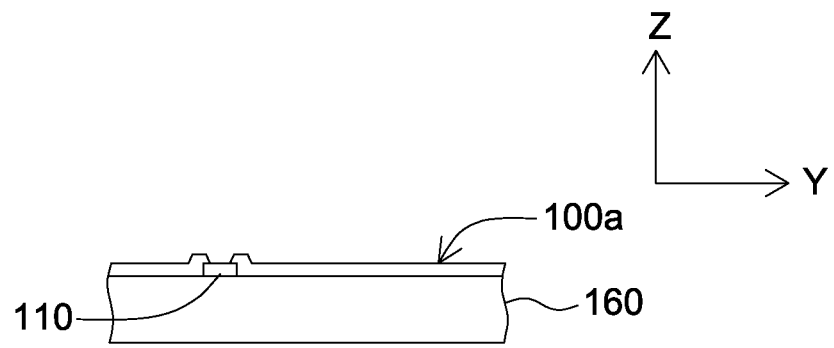
Figure 9B:
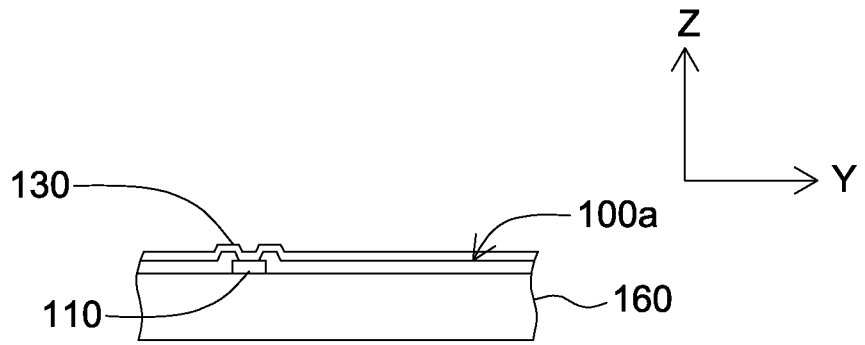
Figure 9C:
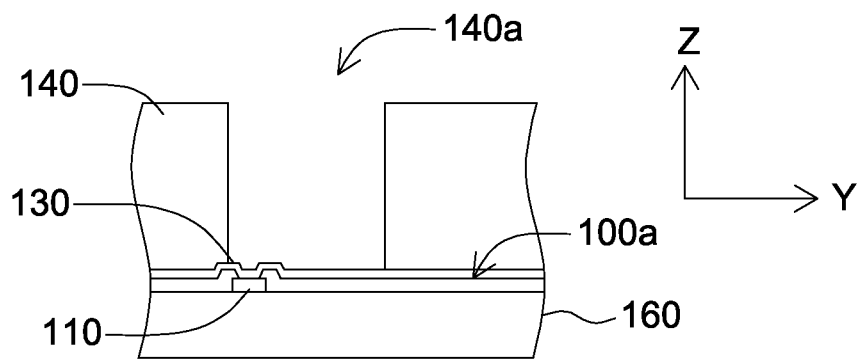
Figure 10:
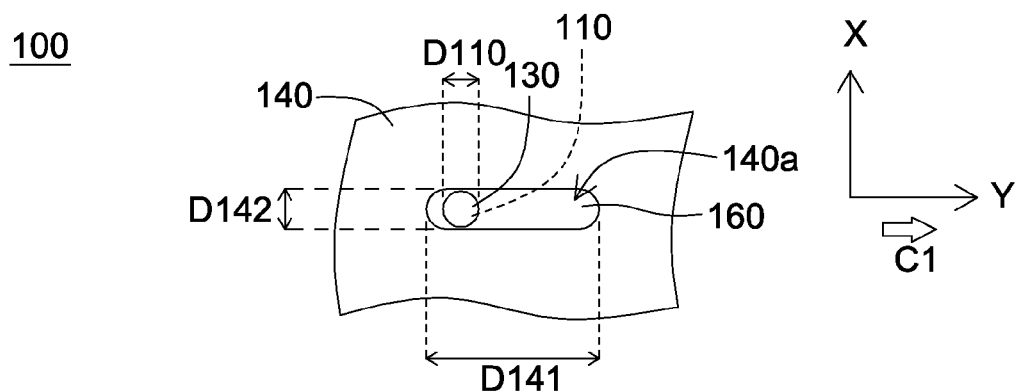
Figure 11:
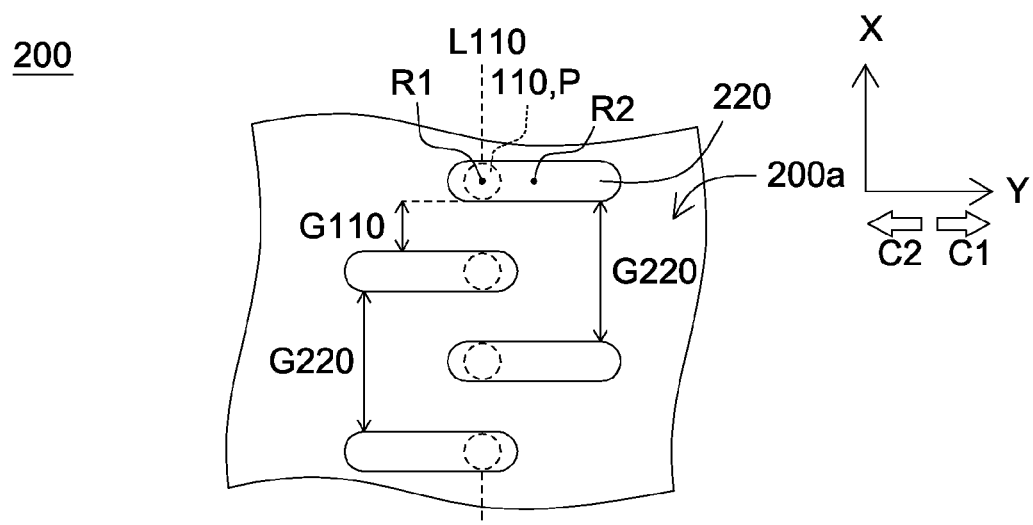
Figure 12:
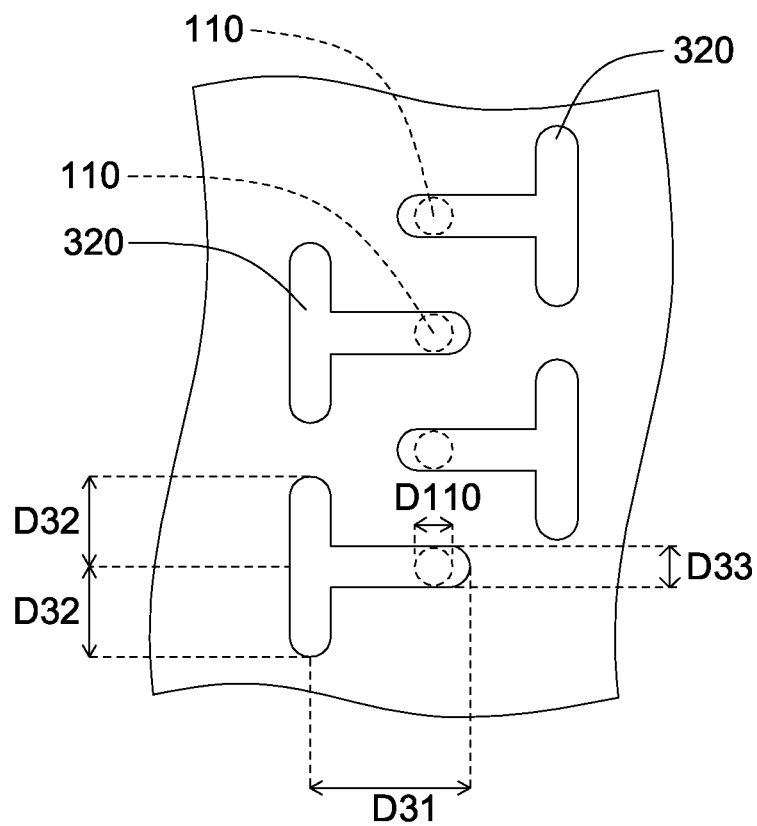
Figure 12:
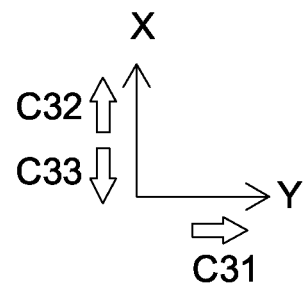

FIGS. 9A~9F illustrate each step of the method for manufacturing a bump and a semiconductor device using the same;

FIG. 10 is a top view of a die and a photosensitive material of FIG. 9C;

FIG. 11 illustrates the disposition of a bump of a semiconductor device according to a second embodiment of the invention; and FIG. 12 illustrates the disposition of a bump of a semiconductor device according to a third embodiment of the invention.

DETAILED DESCRIPTION OF THE INVENTION

First Embodiment

Figure 1:
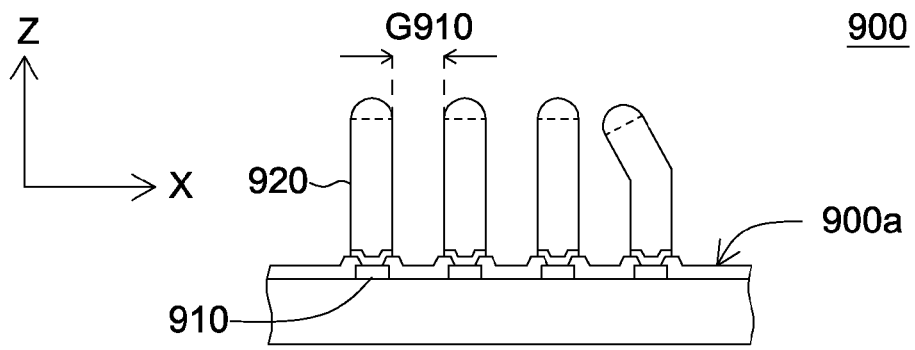
Figure 2:
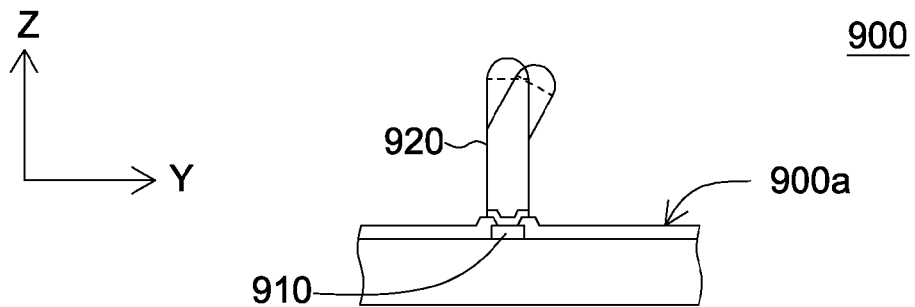
Figure 3:
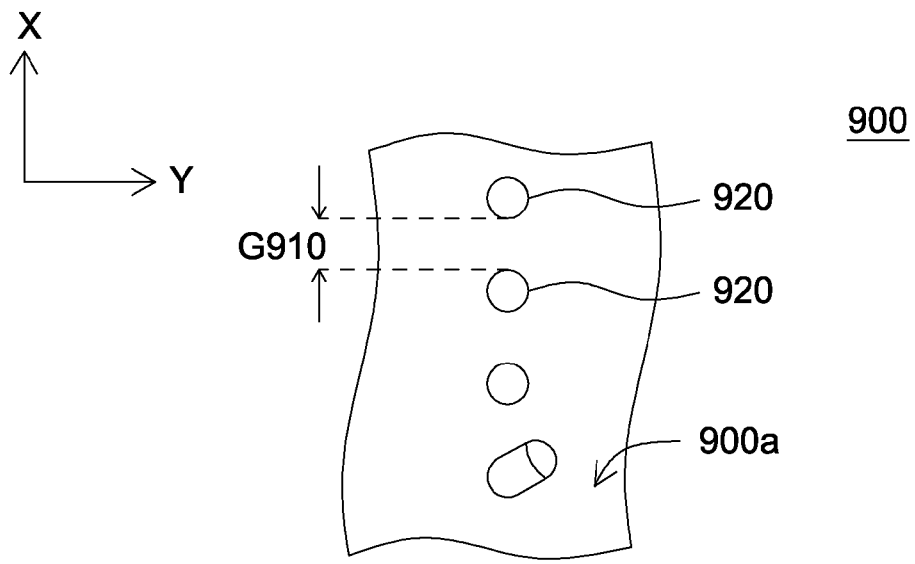
Figure 4:
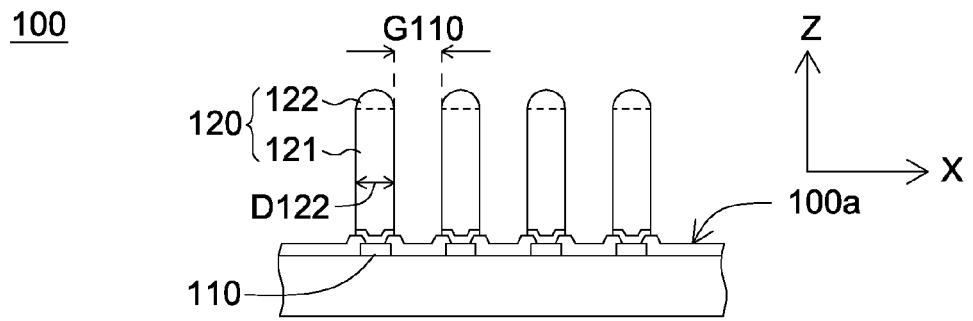
Figure 5:
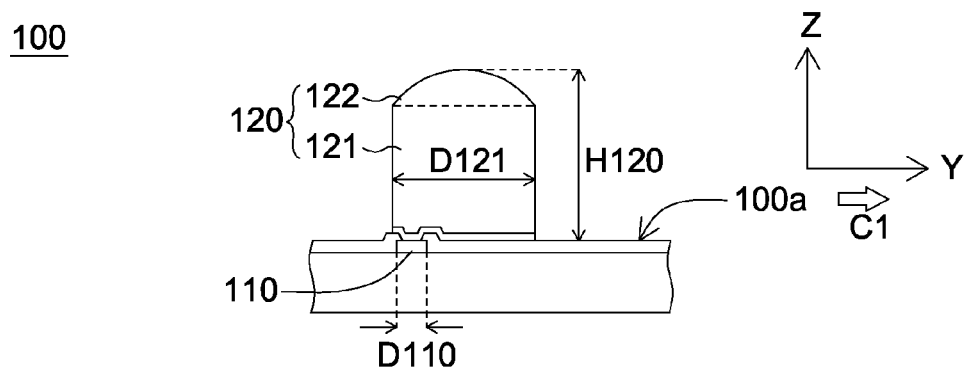
Figure 6:
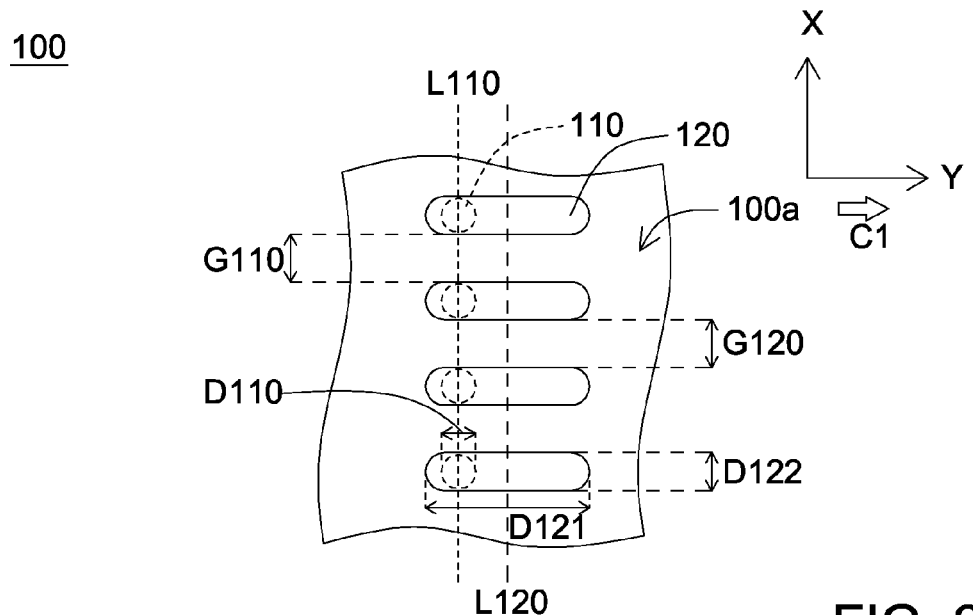
FIG. 6 is a top view of a semiconductor device of FIGS. 4~5.

Referring to FIG. 4~6, FIGS. 4~5 are side views of a semiconductor device 100 according to a first embodiment of the invention. FIG. 6 is a top view of a semiconductor device of FIGS. 4~5. As indicated in FIG. 4, the semiconductor device 100 has an active surface 100a and includes at least a bonding pad 110 and at least a bump 120. The bonding pad 110 disposed on the active surface 100a is a connecting element for electrically connecting the active surface 100a to the bump 120. The bump 120 is vertically disposed on the bonding pad 110. As indicated in FIG. 6, the bump has a first dimension D121 and a second dimension D122 both parallel to the active surface 100a, wherein the first dimension D121 is illustrated in FIG. 5 and FIG. 6, and the second dimension D122 is illustrated in FIG. 4 and FIG. 6. The first dimension D121 is more than 1.2 times the second dimension D122. As the structural strength of miniaturized elements is emphasized in the present embodiment of the invention, the minimum dimension of the bump 120 (the second dimension D122 in the present embodiment of the invention) is preferably smaller than 100 microns. The minimum dimension of the bonding pad 110 is preferably smaller than the minimum dimension of the bump 120, that is, smaller than 100 microns, and the minimum dimension of the bonding pad 110 is preferred to be smaller than 80 microns. Meanwhile, the cross-sectional area of the bonding pad 110 is preferably symmetric with respect to the center. For example, the shape of the cross-sectional area of the bonding pad 110 is circularly-shaped, square-shaped, diamond-shaped, rectangle-shaped or elliptically-shaped, but is not limited thereto. Furthermore, as shown in said drawings, the center of the bonding pad 110 disposed in the active surface 100a and the center of the bump 120 are not aligned with each other. That is, the connecting lines of the centers of the bonding pads 110 (L110) and the bumps 120 (L120) are disposed in an off-centered arrangement.

In the present embodiment of the invention, the first dimension D121 is perpendicular to the second dimension D122, wherein the first dimension D121 is the maximum dimension of the bump 120 parallel to the active surface 100a, and the second dimension D122 is the minimum dimension of the bump 120 parallel to the active surface 100a. As indicated in FIG. 6, the cross-sectional area of the bump 120 parallel to the active surface 100a is preferably an I-shaped structure but is not limited thereto. Normally, the I-shaped bump 120 is stronger than the circularly-shaped bump.

Besides, as indicated in FIG. 6, one end of the bump 120 at least extends from the bonding pad 110 in a direction C1 (the direction of the Y-axis). The extending direction C1 is parallel to the active surface 100a, and the length D121 of the extending direction C1 of the bump 120 is greater than 1.2 times the width D122 of the bump 120. In the present embodiment of the invention, the length D121 of the extending direction C1 of the bump 120 is equivalent to the maximum dimension D121 of the bump 120 and the width of the bonding pad D110 is preferably smaller than the width D121 of the bump. That is, the bump 120 not only covers the bonding pad 110 but also extends in the direction C1.

Thus, the part of the bump 120 covers the bonding pad 110, the extended part of the bump 120 covers part of the active surface 100a. The bump 120 contacts the active surface 100a by an area larger than 1.2 times the area of the bonding pad 110. Therefore, under the trend of miniaturization in the design of the semiconductor device 100, despite that the dimension and the pitch of the bonding pad 110 are reduced, the bump 120 still maintains a certain level of structural strength.

Referring to FIG. 5, the bump 120 includes a pillar part 121 and a top part 122. The bottom of the pillar part 121 is disposed on the bonding pad 110, and the top part 122 is disposed on the top of the pillar part 121 and extends from the top of the pillar part 121. The top part 122, which will melt and reflow at a pre-determined temperature, can be selected from a group consisting of solder, tin (Sn)-lead (Pb) or any lead free solder. At the pre-determined temperature, the pillar part 121 will not melt and the material thereof is selected from a group consisting of copper (Cu), gold (Au), nickel (Ni) or a combination thereof, wherein copper (Cu) is preferred in the present embodiment of the invention. The manufacturing method of the pillar part 121 and the top part 122 of the bump 120 is exemplified in FIG. 7.

Figure 7:
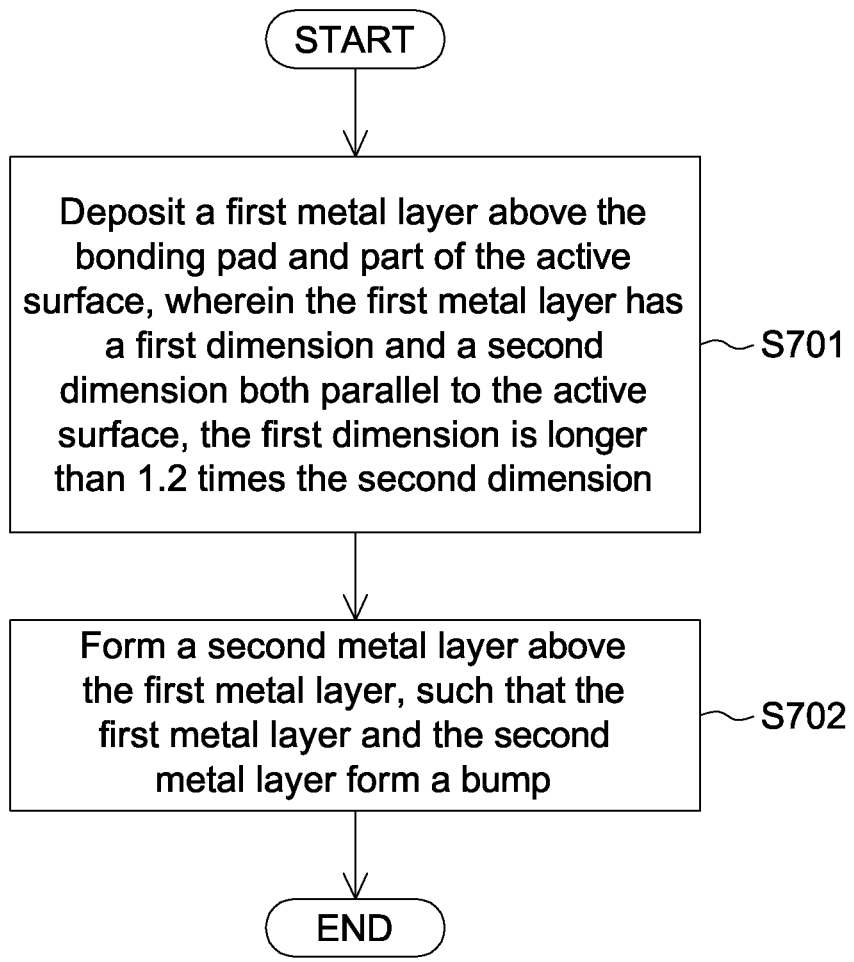
FIG. 7 is a flowchart of a method for manufacturing a semiconductor device according to a preferred embodiment of the invention.

Referring to both FIG. 7 and FIGS. 9A~9F. FIG. 7 is a flowchart of a method for manufacturing a semiconductor device according to a preferred embodiment of the invention. FIGS. 9A~9F illustrate each step of the method for manufacturing a bump and a semiconductor device using the same. The manufacturing method of the bump of the invention and a semiconductor device using the same at least includes the following two steps.

Firstly, the method begins at step S701. As indicated in FIGS. 9A~9D, a first metal layer 151 is deposited on the bonding pad 110 and part of the active surface 100a, wherein the first metal layer 151 has a first dimension D121 and a second dimension D122 both parallel to the active surface 100a, and the first dimension D121 is more than 1.2 times the second dimension D122. That is, the second dimension D122 of the first metal layer 151 is equivalent to the second dimension D122 of FIG. 5. The material of the first metal layer 151 is selected from a group consisting of copper, gold, nickel or the alloy thereof. That is, the material of the first metal layer 151 is selected from the same group that may form the pillar part 121. The first metal layer 151 can be formed by a semiconductor manufacturing process such as electroplating, evaporating or sputtering.

Figure 9D:
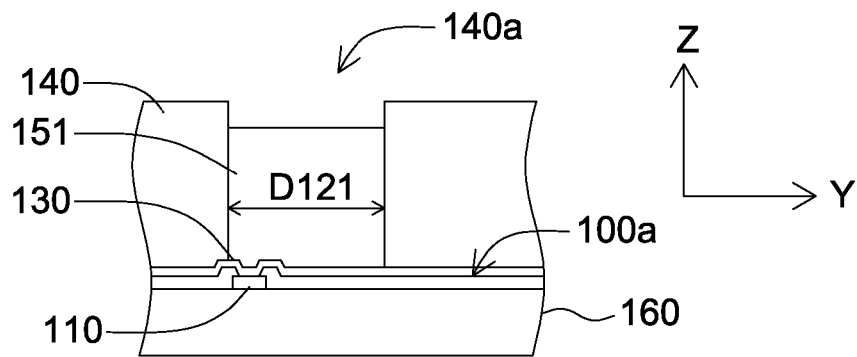
Figure 9E:
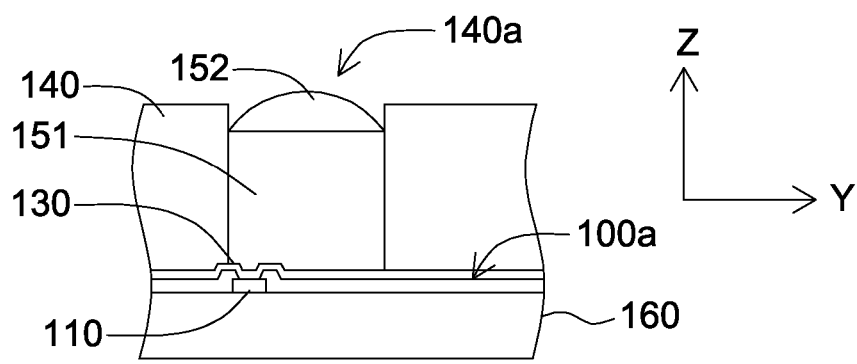
Figure 9F:
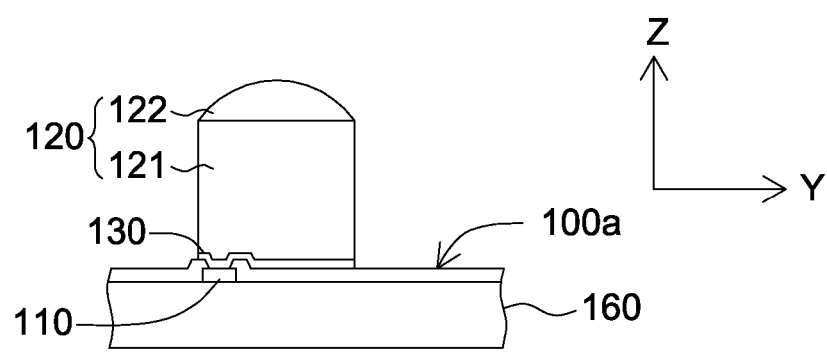

Secondly, the method proceeds to step S702. As indicated in FIGS. 9E~9F, a second metal layer 152 is formed above the first metal layer 151, such that the first metal layer 151 and the second metal layer 152 form the bump 120. The material of the second metal layer 152 is selected from a group consisting of tin (Sn)-lead (Pb) or any lead free solder. That is, the material of the second metal layer 152 is selected from the same group of materials from which the materials of the top part 122 is formed, wherein the second metal layer 152 is mainly composed of solder. The second metal layer 152 can be formed by a semiconductor manufacturing process such as electroplating, evaporating or sputtering or printing.

Figure 8:
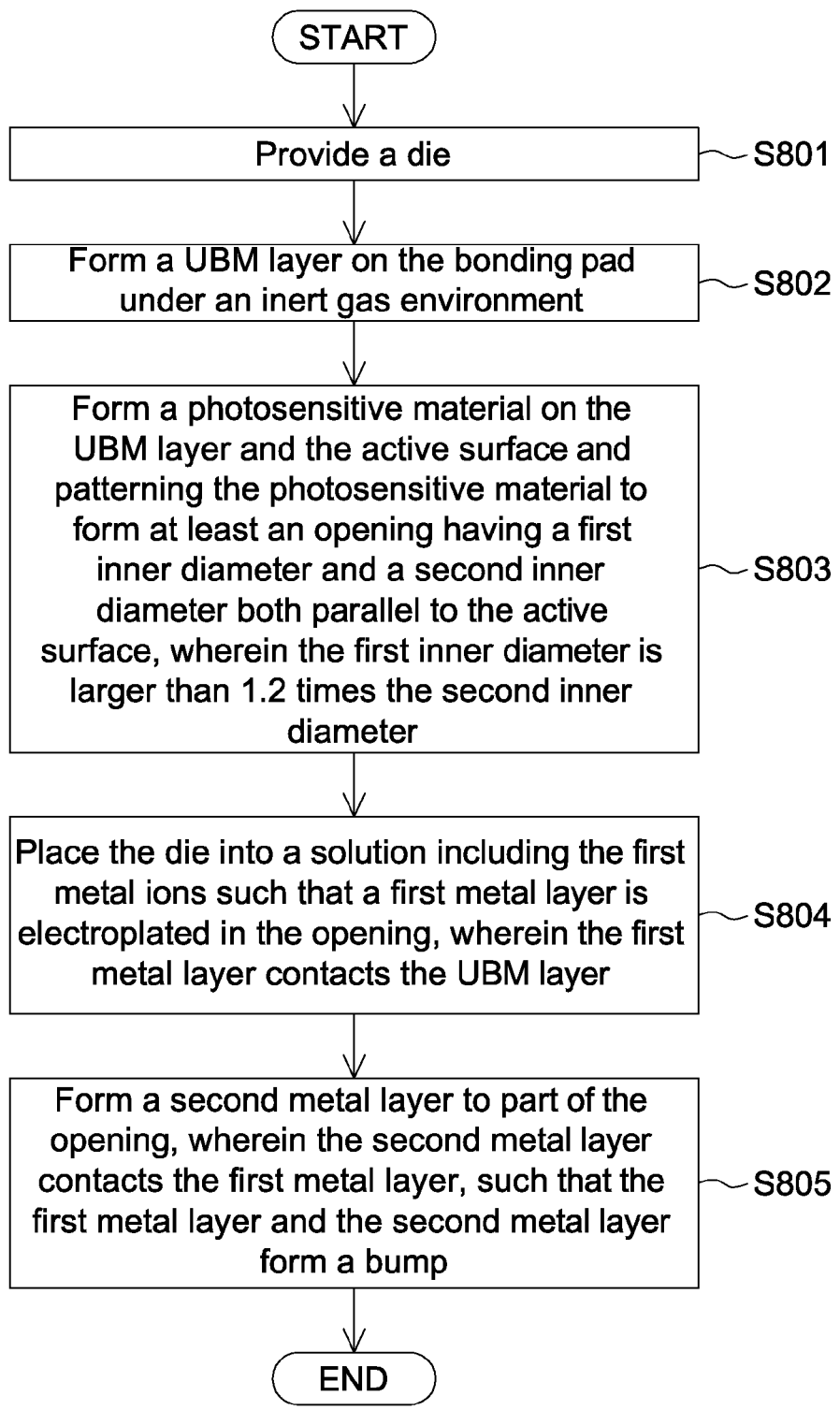
FIG. 8 is detailed flowchart of a method for manufacturing a semiconductor device according to a preferred embodiment of the invention.

The manufacturing method of the semiconductor device 100 of the present embodiment of the invention is exemplified by a plurality of semiconductor manufacturing processes. Referring to both FIG. 8 and FIGS. 9A~9F. FIG. 8 is a detailed flowchart of a method for manufacturing a semiconductor device 100 according to a preferred embodiment of the invention.

Firstly, the method begins at step S801 of FIG. 8. As indicated in FIG. 9A, a die 160 is provided, wherein the die 160 includes a bonding pad 110 disposed on the active surface 100a of the die 160. In the manufacturing process of semiconductor, the die 160 is formed by dividing a wafer. Normally, the wafer is used as a manufacturing unit, and the wafer is divided into a plurality of semiconductor devices 100 after the bump 120 is formed.

Next, the method proceeds to step S802 of FIG. 8. As indicated in FIG. 9B, under an inert environment, an under-bump metallurgy (UBM) layer 130 is formed on the bonding pad 110 and the entire active surface 100a using sputtering or evaporation. An apparatus is used to evacuate the chamber to achieve the level of $1\times10^{-7}$ torr to $1\times10^{-8}$ torr. The pressure inside the chamber can be appropriately adjusted according to actual needs during the manufacturing process. In the present embodiment of the invention, preferably, the apparatus evacuates the chamber to achieve a level of $5\times10^{-7}$ torr to $1\times10^{-8}$ torr. Then, argon is infused to the chamber until the pressure inside the chamber reaches a few millitorr up to 100 millitorr and the manufacturing process of sputtering is performed under the resulting inert gas environment.

In step S802, titanium (Ti), copper (Cu), tungsten (W), nickel (Ni) palladium (Pd) or gold (Au) is used as a target material for sputtering or evaporating a titanium-copper (Ti—Cu) stacked structure, a titanium-tungsten-copper (Ti—W—Cu) stacked structure, a titanium-nickel (Ti—Ni) stacked structure or a titanium-palladium-gold (Ti—Pd—Au) stacked structure to form the UBM layer 130. The UBM layer 130 is composed of an adhesive layer, a barrier layer or a wetting layer, and the material for the UBM layer 130 is determined according to the design of the product.

Next, the method proceeds to step S803 of FIG. 8. As indicated in FIG. 9C, a photosensitive material 140 is formed on the UBM layer 130 and the active surface 100a. The photosensitive material 140 is patterned to form at least an opening 140a for exposing the UBM layer 130 above the bonding pad 110 and part of the active surface 100a.

Referring to FIG. 10, a top view of a die 160 and a photosensitive material 140 of FIG. 9C is shown. In step S803, the opening 140a has a first inner diameter D141 and a second inner diameter D142 both parallel to the active surface 100a, wherein the first inner diameter D141 is greater than 1.2 times the second inner diameter D142. That is, the cross-sectional area of the opening 140a parallel to the active surface 100a is an I-shaped structure. The opening 140a extends from the bonding pad 110 in a direction C1, wherein the length D141 of the opening 140a in the extending direction C1 is greater than 1.2 times the width D142 of the opening 140a. That is, the extended length D141 of the opening 140a is equivalent to the first inner diameter D141 of the opening 140a and the width D142 of the opeining 140a is the equivalent to the second inner diameter D142 of the opening 140a.

Next, the method proceeds to step S804 of FIG. 8. As indicated in FIG. 9D, the die 160 is placed into a solution including the first metal ions so as to electroplate the first metal layer 151 in the opening 140a. The first metal layer 151 contacts the UBM layer 130. In the present embodiment of the invention, the solution includes copper ions (Cu), sulfuric acid ($H_2SO_4$) and chloride ions to form the first metal layer 151 whose material includes copper.

In step S804, copper ions have a concentration in the range of 10~40 gram/liter, sulfuric acid has a concentration in the range of 120~300 gram/liter, and chloride ions have a concentration in the range of 30~70 ppm. The components and concentrations of the solution can be adjusted and controlled according to the machine parameters and the to-be-formed first metal layer 151. In the present embodiment of the invention, the operating temperature is preferably set to be 20~30 degrees Celsius, and the concentration of the copper ions is controlled to be in the range of 20~35 gram/liter, the concentration of the sulfuric acid is controlled to be in the range of 150~250 gram/liter, the concentration of the chloride ions is controlled to be in the range of 35~60 ppm.

Then, the method proceeds to step S805 of FIG. 8. As indicated in FIGS. 9E~9F, the second metal layer 152 is formed in the opening 140a, and the second metal layer 152 contacts the first metal layer 151. Next, the second metal layer 152 is reflowed, such that the first metal layer 151 and the second metal layer 152 form a bump 120 as indicated in FIG. 9F. The ways of forming the second metal layer 152 include electroplating, evaporating, sputtering and printing.

Next, as indicated in FIG. 9F, the above photosensitive material 140 is removed, and the part of the UBM layer 130 not covered by the bump 120 is etched away. The step of removing the photosensitive material 140 can be performed before or after the step of reflowing the second metal layer 152, and the sequence of the manufacturing process can be designed to fit actual needs. In the present embodiment of the invention, the bump 120 is completed by reflowing the second metal layer 152 first and subsequently removing the photosensitive material 140.

Referring to FIG. 6, the semiconductor device 100 includes a plurality of bonding pads 110 and a plurality of bumps 120. Each of the bumps 120 corresponds to each of the bonding pads 110, and the directions C1 in which the bumps 120 extend from the bonding pads 110 are substantially parallel to each other.

The bonding pads 110 are arranged along a line L110. The bumps 120 extend in a uniform direction C1 from the bonding pads 110. The pitch G120 between the adjacent bumps 120 remains approximately the same with the pitch G110 between the adjacent bonding pads 110 without significant reduction. Thus, under the circumstance that the pitch G120 between the bumps 120 is not reduced, the bumps 120 formed according to the structural design and manufacturing method thereof disclosed in the above embodiment have better structural strength.

Besides, a plurality of contact points (not illustrated in the diagram) can be disposed on the flip-chip carrier corresponding to the bumps 120 to be electrically connected with the bumps 120. Compared with the bumps, the contact points are outwardly disposed on the flip-chip carrier in a fan-out arrangement or a fan-in arrangement. The distance between the contact points disposed on the flip-chip carrier is larger than the distance between the bonding pads 110 disposed on the active surface. That is, conventionally the bonding pads disposed on the active surface 100a are arranged in a line, and the contact points disposed on the flip-chip carrier are positioned directly above the line to form the other line. In the present embodiment of the invention, the contact points disposed on the flip-chip carrier contact the bumps disposed on the die and form electrical connection thereto. Due to the shape of the extension of the bump 120, the contact points disposed on the flip-chip carrier do not need to form another line directly above the line formed by the bonding pads disposed on the active surface, but rather the contact points disposed on the flip-chip carrier can be arranged in a line not directly above the line formed by the bonding pads disposed on the active surface. Furthermore, as applied in a memory module, the connecting lines of the centers of the bonding pads 110 (L110) and the bumps 120 (L120) disclosed in the embodiment of the present invention are disposed in an off-centered arrangement. And the bumps 120 can extend toward various directions and connect with the contact points disposed on a flip-chip carrier. Therefore, the bonding pads 110 disposed on the active surface 100a need not be disposed in only one line, but can be disposed in two lines or a non-straight line.

The structural design of the shape of the extension of the bump 120 in the present invention can replace the conventional way of extending the length of the bonding pad for enabling the non-extendable bump to contact the contact points disposed on the flip-chip carrier. Furthermore, with the arrangement of the contact points, such as the fan-out arrangement, the distance between the contact points can be further enlarged for the manufacturing process with lower pitch requirements. Preferably, the distance between the contact points is larger than the manufacturing process of 30 microns, but the technology of the invention is not limited thereto.

Second Embodiment

The semiconductor device 200 and manufacturing method thereof of the present embodiment of the invention differs with the semiconductor device 100 and manufacturing method thereof of the first embodiment in the disposition of the bump 220, and other similarities are not repeated here. Referring to FIG. 11, the disposition of a bump 220 of a semiconductor device 200 according to a second embodiment of the invention is shown. In the present embodiment of the invention, the semiconductor device 200 includes a plurality of bonding pads 110 and a plurality of bumps 220. Each of the bumps 220 corresponds to each of the bonding pads 110, and the directions C1 and C2 in which the bumps 220 extend from the bonding pads 110 are substantially parallel to each other. A plurality of bumps 220 are disposed on and electrically connected to the corresponding bonding pads 110 at a plurality of contacting position P (substantially corresponding to the location of the bonding pads 110), each contacting position P having a contacting center R1. In particular, the center of each bump R2 is not aligned vertically (not vertically aligned) with the contacting center R1. The bonding pads 110 are arranged along a line L110 and the bumps 220 alternately extend in opposite directions C1 and C2 from the bonding pads 110 to form a fan-out arrangement.

There is a larger pitch G220 between the bumps 220 extending in the same direction C1. Likewise, there is a larger pitch G220 between the bumps 220 extending in the same direction C2. The pitch G220 is equivalent to two or more times the pitch G110 of the bonding pad 110. Therefore, during the assembly of the semiconductor device 200, the bump 220 and the flip-chip carrier can be more easily connected electrically, hence preventing shortcircuiting between neighboring bumps.

Like the first embodiment, a plurality of contact points (not illustrated in the diagram) are disposed on the flip-chip carrier corresponding to the bump 220 for electrically connecting with the top part (the solder) of the bump 220. Compared with the bump, the contact points are outwardly disposed on the flip-chip carrier in a fan-out arrangement. The distance between the contact points disposed on the flip-chip carrier is larger than the distance between the bonding pads 110 disposed on the active surface. That is, conventionally the bonding pads disposed on the active surface are arranged in a line, and the contact points disposed on the flip-chip carrier are positioned directly above the line to form another line. In the present embodiment of the invention, the contact points disposed on the flip-chip carrier contact the bumps disposed on the die and form electrical connection thereto. Due to the shape of the extension of the bump 220, the contact points disposed on the flip-chip carrier do not need to form the other line directly above the line formed by the bonding pads disposed on the active surface, but rather, the contact points disposed on the flip-chip carrier can be arranged in a line not directly above the line formed by the bonding pads disposed on the active surface.

The structural design of the shape of the extension of the bump 220 in the present invention can replace the conventional way of extending the length of the bonding pad for the non-extendable bump to contact the contact points disposed on the flip-chip carrier. Furthermore with the arrangement of the contact points, such as the fan-out arrangement, the distance between the contact points can be further enlarged for the manufacturing process with lower pitch requirements.

Third Embodiment

The semiconductor device 300 and manufacturing method thereof of the present embodiment of the invention differs with the semiconductor device 200 and manufacturing method thereof of the second embodiment in the structural design of the bump 320, and other similarities are not repeated here. Referring to FIG. 12, the disposition of a bump 320 of a semiconductor device 300 according to a third embodiment of the invention is shown. In the present embodiment of the invention, the bump 320 of the semiconductor device 300 has a substantially T-shaped cross-sectional area parallel to the active surface 300a.

As indicated in FIG. 12, after the T-shaped bump 320 substantially extends a first distance D31 in a first direction C31 from the bonding pad 110, the bump 320 extends a second distance D32 in a second direction C32 and a third direction C33 respectively. The first distance D31 is more than 1.2 times the width D33 of the bump 320.

The cross-sectional area of the bump is exemplified by an I-shaped structure or a T-shaped structure in the above embodiments. However, the cross-sectional area of the bump can also be an elliptically-shaped structure or a rectangularly shaped structure as long as the first dimension of the bump is more than 1.2 times the second dimension. For example, in the T-shaped structure, the two lines forming the T-shaped structure can have the same length. However, the dimension of the length of the line divided by the other line is not the physical dimension because the dimension of the length amounts to a smaller proportion of the overall dimension. The physical dimension is the average of the width. Meanwhile, the length of the extension of the bump is greater than 1.2 times the width of the bump. Moreover, the bump does not need to completely cover the bonding pad, the bump only needs to cover part of the bonding pad, and such variation is still within the scope of technology of the invention.

In the above embodiments, the bump edge of covers the bonding pad. However, covering the bonding pad by the central part of the bump is within the scope of technology of the invention as long as the length of the extension of the bump is more than 1.2 times the width of the bump Likewise, during the manufacturing process of the bump and a semiconductor device using the same, the bonding pad can also be positioned at the central part of the opening.

In the semiconductor device and manufacturing method thereof according to the above embodiments of the invention, the first dimension of the bump is more than 1.2 times the second dimension, or the length of the extension of the bump is more than 1.2 times the width of the bump, such that the semiconductor device and manufacturing method thereof still possess excellent structural strength under the restriction of fine pitches. Thus the semiconductor device and manufacturing method thereof disclosed in the above embodiments of the invention at least has the following advantages:

Firstly, the structural strength is enhanced. The structural strength of the bump of the semiconductor device is greatly enhanced, hence preventing the bump from being bent or short-circuited.

Secondly, the yield rate is improved. As the structural strength of the bump is enhanced, the semiconductor device is less likely to be damaged during the process of assembly or removal, and the yield rate is thus improved.

Thirdly, the manufacturing cost is reduced. During the manufacturing process, there is no need to invest a large amount of labor and material for inspection or re-working as the defective products are minimized, hence the manufacturing cost is greatly reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor device, comprising the steps of:
    providing a chip having an active surface and a plurality of bonding pads on the active surface;
    forming an underbump metallurgy (UBM) layer on the active surface and the bonding pads;
    forming a photosensitive layer on the UBM layer;
    forming a plurality of openings on the photosensitive layer, wherein each opening exposes part of the UBM layer and corresponds to one bonding pad, and each opening has a coplanar first and second dimension parallel to the active surface, the first dimension being more than 1.2 times the second dimension;
    depositing at least a first metal layer in the openings of the photosensitive layer, wherein the first metal layer is formed on the UBM layer;
    depositing at least a second metal layer in the openings of the photosensitive layer, wherein the second metal layer is formed on the first metal layer;
    removing the photosensitive layer to expose the UBM layer;
    removing the exposed UBM layer to expose the active surface of the chip; and
    applying heat so as to reflow the second metal layer at the predetermined temperature without reflowing the first metal layer and form a plurality of bumps on the corresponding bonding pads, wherein each bump has a pillar part and a top part.

2. The method according to claim 1, wherein the pillar part has a coplanar first and second dimension parallel to the active surface, the first dimension being more than 1.2 times the second dimension.

3. The method according to claim 1, wherein the pillar part is formed on the corresponding bonding pad at a contacting position having a contacting center and the center of the pillar part is not aligned vertically with the contacting center.

4. The method according to claim 1, wherein the pillar part is formed on the corresponding bonding pad and extends onto an area of the active surface that is larger than 1.2 times the contact area of the bonding pad.

5. The method according to claim 1, wherein the underbump metallization (UBM) layer comprises at least an adhesion layer, a barrier layer or a wetting layer.

6. The method according to claim 5, wherein the underbump metallization (UBM) layer forms a multi-stacked metal layer structure and comprises titanium (Ti), tungsten (W), chromium (Cr), gold (Au), copper (Cu) or nickel (Ni).

7. The method according to claim 1, wherein the first metal layer forms the pillar part and comprises copper (Cu), gold (Au) or nickel (Ni), and the second metal layer forms the top part and comprises tin (Sn) or lead (Pb).

8. The method according to claim 1, wherein the first metal layer of the pillar part is formed by deposition in a solution comprising copper ions ($Cu^{++}$), sulfuric acid ($H_2SO_4$) and chloride ions.

9. The method according to claim 8, wherein the copper ions have a concentration between 10~40 gram/liter, the sulfuric acid has a concentration between 120~300 gram/liter, and the chloride ions have a concentration between 30~70 ppm.

10. A method of manufacturing a semiconductor device, comprising the steps of:
providing a chip having an active surface and a plurality of bonding pads on the active surface;
forming an underbump metallurgy (UBM) layer on the active surface and the bonding pads;
forming a photosensitive layer on the UBM layer and patterning the photosensitive layer to form an opening corresponding to each bonding pad, wherein the opening exposes the UBM layer and has a coplanar first and second dimension parallel to the active surface, the first dimension being more than 1.2 times the second dimension;
depositing at least one metal layer in the opening of the photosensitive layer to form a pillar part, wherein the pillar part is formed on the UBM layer and will not melt at a predetermined temperature;
depositing at least one solderable metal layer in the opening of the photosensitive layer to form a top part, wherein the top part is formed on the pillar part and will melt at the predetermined temperature;
removing the photosensitive layer to expose the UBM layer; and
removing the exposed UBM layer to expose the active surface of the chip.

11. The method according to claim 10 wherein the opening is formed on the corresponding bonding pad at a contact position have a contacting center and the center of the opening is not aligned vertically with the contacting center.

12. The method according to claim 10 wherein the opening is formed on the corresponding bonding pad and extends onto an area of the active surface that is larger than 1.2 times the area of the bonding pad.

13. The method according to claim 10, wherein the step of forming the underbump metallurgy (UBM) layer is performed in an inert gas environment with 2~10 mtorr of argon.

14. The method according to claim 10, wherein the underbump metallization (UBM) layer forms a multi-stacked metal layer structure and comprises titanium (Ti), tungsten (W), chromium (Cr), gold (Au), copper (Cu) or nickel (Ni).

15. The method according to claim 10, wherein the pillar part and the top part form a bump, the at least one metal layer of the pillar part comprises copper (Cu), gold (Au) or nickel (Ni) and the at least one solderable metal layer of the top part comprises of tin (Sn) or lead (Pb).

16. The method according to claim 10, wherein the at least one metal layer of the pillar part is formed by deposition in a solution comprising copper ions ($Cu^{++}$), sulfuric acid ($H_2SO_4$) and chloride ions.

17. The method according to claim 11, wherein the copper ions have a concentration between 10~40 gram/liter, the sulfuric acid has a concentration between 120~300 gram/liter, and the chloride ions have a concentration between 30~70 ppm.

* * * * *